(12) United States Patent
Chen et al.

(10) Patent No.: US 11,637,112 B2
(45) Date of Patent: Apr. 25, 2023

(54) NON-VOLATILE MEMORY DEVICE AND METHOD FOR MANUFACTURING THE SAME

(71) Applicant: Winbond Electronics Corp., Taichung (TW)

(72) Inventors: Chun-Hao Chen, Taichung (TW); Wei-Kuang Chung, Nantou County (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 17/191,074

(22) Filed: Mar. 3, 2021

(65) Prior Publication Data

US 2021/0280589 A1     Sep. 9, 2021

(30) Foreign Application Priority Data

Mar. 5, 2020  (TW) .................................. 109107213

(51) Int. Cl.
| | |
|---|---|
| *H01L 27/11521* | (2017.01) |
| *H01L 29/788* | (2006.01) |
| *H01L 29/423* | (2006.01) |
| *H01L 29/66* | (2006.01) |
| *H01L 21/28* | (2006.01) |

(52) U.S. Cl.
CPC .. *H01L 27/11521* (2013.01); *H01L 29/40114* (2019.08); *H01L 29/42324* (2013.01); *H01L 29/66825* (2013.01); *H01L 29/7883* (2013.01)

(58) Field of Classification Search
None
See application file for complete search history.

(56) References Cited

U.S. PATENT DOCUMENTS

| | | | |
|---|---|---|---|
| 6,828,198 B2 | 12/2004 | Su et al. | |
| 8,036,036 B2 | 10/2011 | Nishiyama | |
| 2004/0188777 A1* | 9/2004 | Hwang | ................ H01L 27/112 257/E21.678 |
| 2010/0046294 A1* | 2/2010 | Jeong | ................ G11C 16/0483 365/185.11 |

FOREIGN PATENT DOCUMENTS

| | | |
|---|---|---|
| TW | 200505011 A | 2/2005 |
| TW | 200822346 A | 5/2008 |

* cited by examiner

*Primary Examiner* — Xiaoming Liu

(74) *Attorney, Agent, or Firm* — Muncy, Geissler, Olds & Lowe, P.C.

(57) ABSTRACT

A non-volatile memory device and its manufacturing method are provided. The non-volatile memory device includes a substrate and a plurality of first gate structures and a plurality of second gate structures formed on the substrate. The substrate includes a center region and two border regions located on opposite sides of the center region. The center region and two border regions are located in an array region. The first gate structures are located in the center region, and the second gate structures are located in one of the border regions. Each of the first gate structures has a first width, and each of the second gate structures has a second width less than the first width. There is a first spacing between the first gate structures, and there is a second spacing which is greater than the first spacing between the second gate structures.

13 Claims, 5 Drawing Sheets

NON-VOLATILE MEMORY DEVICE AND METHOD FOR MANUFACTURING THE SAME

CROSS REFERENCE TO RELATED APPLICATIONS

This Application claims priority of Taiwan Patent Application No. 109107213, filed on Mar. 5, 2020, the entirety of which is incorporated by reference herein.

BACKGROUND OF THE INVENTION

Field of the Invention

The present disclosure relates to a memory device, and in particular, it relates to a non-volatile memory device and a method for manufacturing the same.

Description of the Related Art

Manufacturing processes have evolved toward miniaturization. In existing flash memory, the contact structure between the gate structures usually has a high aspect ratio, which causes a problem of high contact resistance. In the worst case, such contact structure with high aspect ratio may not be electrically connected to the substrate, thereby causing the failure of the flash memory. As a result, the yield of the flash memory will be reduced. In addition, as the spacing between the gate structures becomes smaller, the uniformity of these contact structures becomes difficult to control, thereby resulting in a non-uniform erasing ability of the memory cells of the flash memory. In order to avoid the above-mentioned problems, the spacing between the gate structures is increased by reducing the width of each gate structure in the memory array. However, as the width of the gate structure is reduced, it will cause a problem of reduced data retention ability and longer operation time. Therefore, how to reduce the contact resistance of the contact structure and improve the uniformity of the contact structures without significantly affecting the data retention ability and the operation time is a subject that the industry in this field is eager to improve.

BRIEF SUMMARY OF THE INVENTION

The embodiments of the present invention provides a non-volatile memory device and a method for manufacturing the same, which can improve the yield, reliability, durability, and operation consistency of the memory device.

In accordance with some embodiments of the present disclosure, a non-volatile memory device is provided. The non-volatile memory device includes a substrate and a plurality of memory cells. The substrate includes a center region and two border regions located in an array region. The border regions are located outside the center region. The memory cells are located in the array region and include a plurality of first gate structures and a plurality of second gate structures formed on the substrate. The first gate structures are located in the center region, and the second gate structures are located in one of the border region. Each of the first gate structures has a first width, and there is a first spacing between two of the first gate structures. Each of the second gate structures has a second width smaller than the first width, and there is a second spacing between two of the second gate structures. The second spacing is greater than the first spacing.

In accordance with some embodiments of the present disclosure, a method for manufacturing a non-volatile memory device is provided. The method includes defining a center region and two border regions of an array region on a substrate and forming a plurality of memory cells located in the array region. The border regions are located outside the center region. Forming a plurality of memory cells includes forming a plurality of first gate structures in the center region of the substrate and forming a plurality of second gate structures in one of the border regions of the substrate. Each of the first gate structures has a first width, and there is a first spacing between two of the first gate structures. Each of the second gate structures has a second width smaller than the first width, and there is a second spacing between two of the second gate structures. The second spacing is greater than the first spacing.

According to the non-volatile memory device and the manufacturing method provided by the embodiments of the present invention, the uniformity of the size of the gate structures can be improved, and the problem of excessively large contact resistance of the subsequently formed contact structure due to the unexpected narrowing of the spacing between the gate structures located in the border region of the array region during the manufacturing process can be avoided. Therefore, the operation consistency of the memory device can be significantly improved, and the failure of the memory device can be reduced or avoided, which can greatly improve the yield, reliability, and durability of the memory device.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
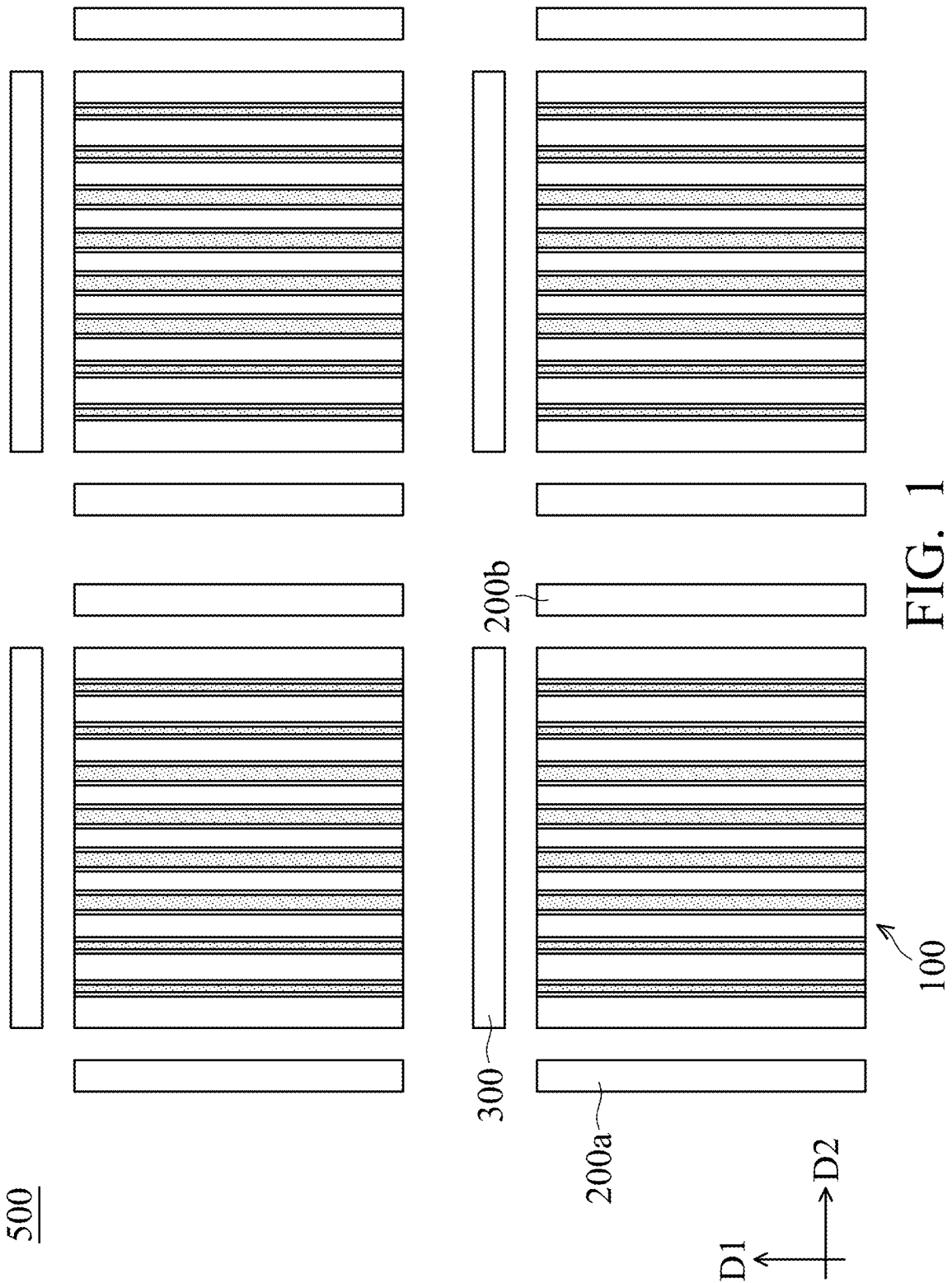
FIG. 1 is a top-view of a non-volatile memory device in accordance with some embodiments.

The present disclosure is best understood from the following detailed description when read with the accompanying figures. The present disclosure may repeat reference numerals and/or letters in the various examples. This repetition is for the purpose of simplicity and clarity and does not in itself dictate a relationship between the various embodiments and/or configurations discussed.

In the disclosure, the term "about" or "approximately" means in a range of 20% of a given value or range, preferably 10%, and more preferably 5%. In the disclosure, if there is no specific explanation, a given value or range means an approximate value which may imply the meaning of "about" or "approximately". In this specification, "X is equal to or similar to Y" means that the absolute value of the difference between the two is within 5.0% of the larger one.

Figure 2:
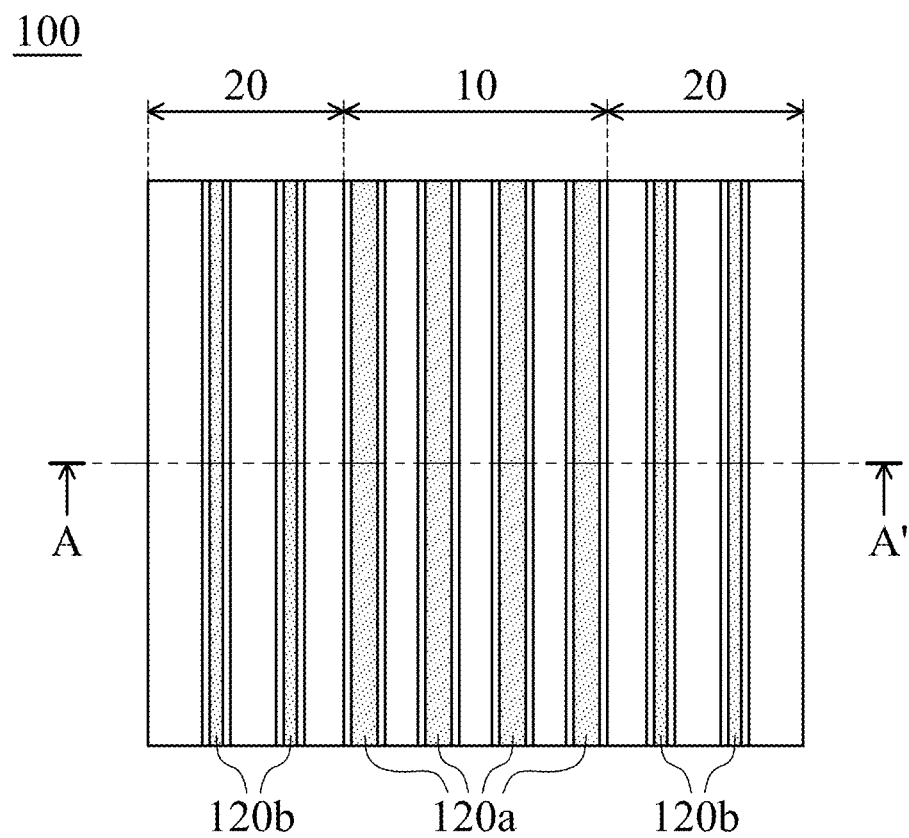
FIG. 2 is a top-view of an array region in accordance with some embodiments.

The embodiments of the present invention provides a non-volatile memory device and a method for manufacturing the same. FIG. 1 is a top-view of a non-volatile memory device 500 in accordance with some embodiments. FIG. 2 is a top-view of an array region 100 in accordance with some embodiments. In one embodiment, the non-volatile memory device is a NOR flash memory.

Referring to FIG. 1 and FIG. 2, the non-volatile memory device 500 includes a plurality of array regions 100 and peripheral circuit regions surrounding the array regions 100. Each array region 100 is composed of a plurality of memory cells, and includes a center region 10 and two border regions 20 located on opposite sides of the center region 10. A plurality of first gate structures 120a parallel to each other are formed in the center region 10 and extend along a first direction D1. A plurality of second gate structures 120b parallel to each other are formed in the border regions 20 and extend along the first direction D1. Each memory cell includes a first gate structure 120a or a second gate structure 120b. In the present embodiment, the long axis of the border region 20 extends along the first direction D1. A plurality of decoders are arranged in the peripheral circuit regions. In the present embodiment, the decoder includes a first bit line selection circuit 200a and a second bit line selection circuit 200b located on opposite sides of the array region 100, and a word line selection circuit 300 located on another side of the array region 100. More specifically, the first bit line selection circuit 200a and the second bit line selection circuit 200b extend along the first direction D1. The word line selection circuit 300 extends along a second direction D2 perpendicular to the first direction D1. By the word line selection circuit 300, the first bit line selection circuit 200a, and the second bit line selection circuit 200b which are adjacent to the array region 100, a specific memory cell can be selected in the array region 100 for corresponding operating. The first bit line selection circuit 200a, the second bit line selection circuit 200b, and the word line selection circuit 300 can be formed by a conventional forming method, which will not be described in detail herein.

FIGS. 3A-3D are cross-sectional views corresponding to various steps of manufacturing an array region 100 in accordance with some embodiments. FIGS. 3A-3D are drawn along line A-A' of FIG. 2.

Figure 3A:
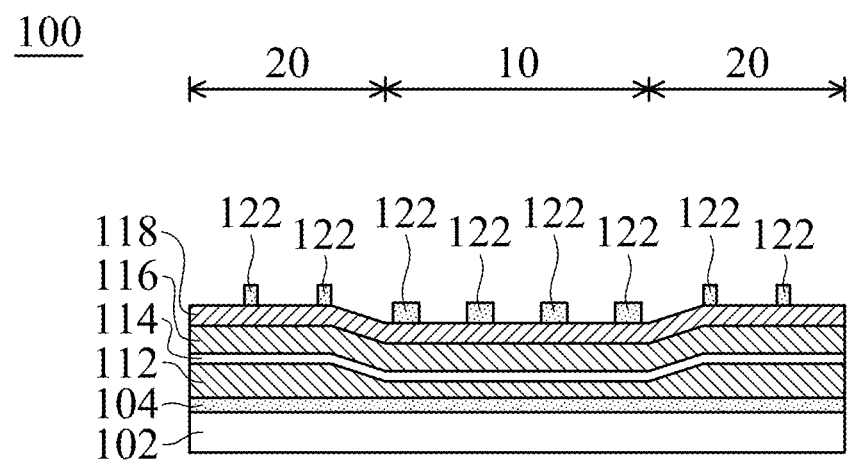
FIGS. 3A-3D are cross-sectional views corresponding to various steps of manufacturing an array region in accordance with some embodiments.

Referring to FIG. 3A, a tunneling oxide layer 104 is formed on a substrate 102. The material of the substrate 102 may include silicon, gallium arsenide, gallium nitride, germanium silicide, silicon on insulator (SOI), or a combination thereof. In the present embodiment, the substrate 102 is a silicon substrate. In some embodiments, other structures may also be formed in the substrate 102, for example, isolation structures, p-type implant regions, or n-type implant regions (not shown). The isolation structure includes a first portion and a second portion. The first portion of the isolation structure is disposed on the second portion of the isolation structure, and the bottom surface of the first portion is higher than the top surface of the substrate 102. In some embodiments, the first portion may be high density plasma oxide, and the second portion may be spin-on glass. The tunneling oxide layer 104 may be formed by, for example, a thermal oxidation process or a deposition process.

Then, a floating gate material is formed on the tunneling oxide layer 104. In the direction (not shown) along the first gate structure 120a and the second gate structure 120b, the floating gate material is filled on the tunneling oxide layer 104 between the isolation structures. The floating gate material may include monocrystalline silicon, polycrystalline silicon, amorphous silicon, or other suitable conductive materials. In the present embodiment, the floating gate material is polycrystalline silicon. The floating gate material can be formed by, for example, a furnace process, a chemical vapor deposition process, an atomic layer deposition process, or a combination of the above processes.

Then, a planarization process (for example, a chemical mechanical polishing process) is performed on the floating gate material so that the top surface of the floating gate material is coplanar with the top surface of the first portion of the isolation structure to form the floating gate layer 112. In some embodiments, the floating gate layer 112 is doped polycrystalline silicon, so it has better conductivity. In such embodiments, the dopant may be a p-type dopant (e.g., boron) or an n-type dopant (e.g., phosphorus). In the present embodiment, after the floating gate layer 112 is formed, the first portion of the isolation structure may be partially removed to form recesses (not shown) between the floating gate layers 112.

Then, a gate dielectric layer 114 is conformally formed on the floating gate layer 112, and a control gate layer 116 is conformally formed on the gate dielectric layer 114. The material of the gate dielectric layer 114 may include oxide, nitride, oxynitride, other suitable dielectric materials, or a combination thereof. In the present embodiment, the gate dielectric layer 114 is a three-layer structure formed of silicon oxide/silicon nitride/silicon oxide. The gate dielectric layer 114 may be formed by a chemical vapor deposition process. The material and forming method of the control gate layer 116 may be the same as or similar to the material and forming method of the floating gate layer 112, which will not be described in detail herein.

Then, a conductive metal layer 118 is conformally formed on the control gate layer 116, and a capping layer material is conformally formed on the conductive metal layer 118. Thereafter, the capping layer material is patterned to form the capping layer 122. The conductive metal layer 118 can be used to electrically connect the gate structure and the external circuit. The material of the conductive metal layer 118 may include tungsten, titanium, tungsten silicide, other suitable metals, or a combination thereof. In the present embodiment, the conductive metal layer 118 is tungsten. The capping layer material may include oxide, nitride, oxynitride, other suitable insulating materials, or a combination thereof. In the present embodiment, the capping layer material includes nitride disposed on the conductive metal layer 118 and oxide disposed on the nitride.

Figure 3B:
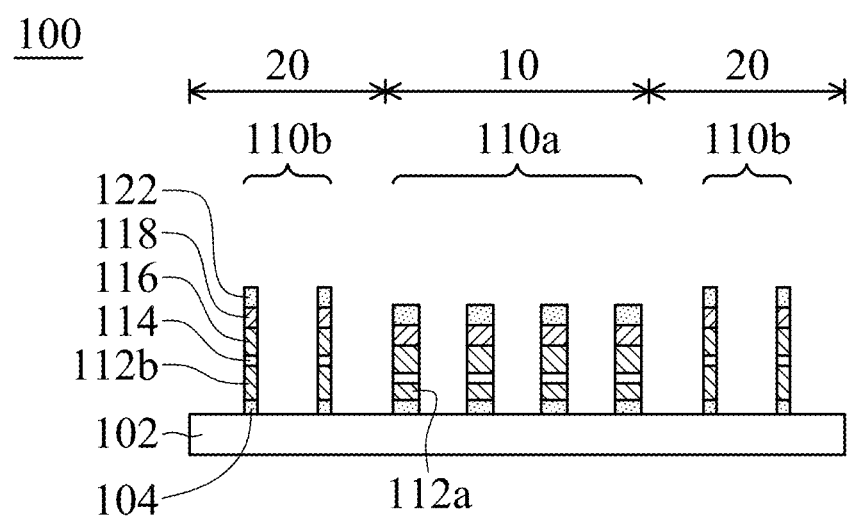

Referring to FIG. 3B, the floating gate layer 112, the gate dielectric layer 114, the control gate layer 116, and the conductive metal layer 118 are patterned by using the capping layer 122 as a mask, so as to form a plurality of first gate stacks 110a and a plurality of second gate stacks 110b on the substrate 102 simultaneously. The width of the first gate stack 110a is greater than the width of the second gate stack 110b, and the spacing between the two first gate stacks 110a is smaller than the spacing between the two second gate stacks 110b. Each first gate stack 110a includes a first floating gate 112a, a gate dielectric layer 114, a control gate layer 116, a conductive metal layer 118, and a capping layer 122 that are sequentially stacked from bottom to top. Each second gate stack 110b includes a second floating gate 112b, a gate dielectric layer 114, a control gate layer 116, a conductive metal layer 118, and a capping layer 122 that are sequentially stacked from bottom to top.

Figure 3C:
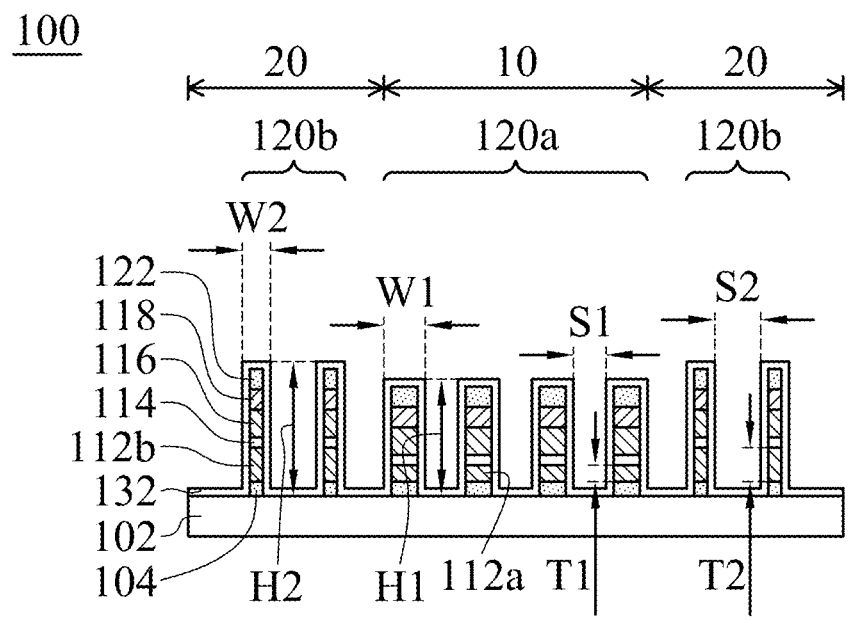

Referring to FIG. 3C, a protective layer 132 is conformally formed to cover the first gate stack 110a, the second gate stack 110b, and the substrate 102, and a plurality of first gate structures 120*a* and a plurality of second gate structures 120*b* is formed on the substrate 102. There is a first spacing S1 between two of the first gate structures 120*a*, and there is a second spacing S2 between two of the second gate structures 120*b*. The second spacing S2 is greater than the first spacing S1. The first gate structure 120*a* has a first width W1, and the second gate structure 120*b* has a second width W2. The first width W1 is greater than the second width W2.

Figure 3D:
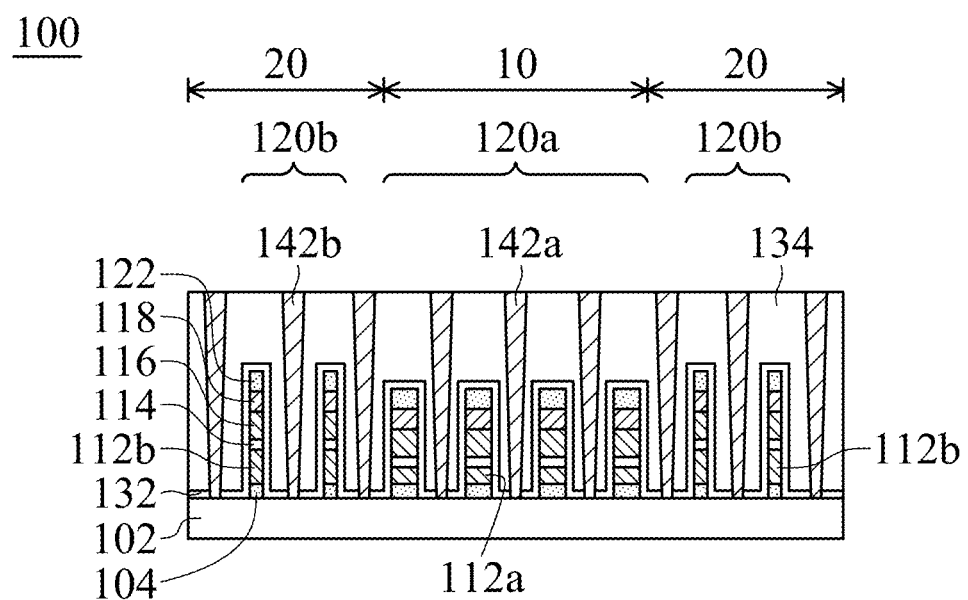

Referring to FIG. 3D, a gap-filling dielectric layer 134 is formed to cover the substrate 102 and fill the gaps between the first gate structures 120*a* and the second gate structures 120*b*. Then, a planarization process may be optionally performed on the gap-filling dielectric layer 134. The material of the gap-filling dielectric layer 134 may include oxide. In the present embodiment, the gap-filling dielectric layer 134 is made from spin-on glass.

Then, an etching process is performed on the gap-filling dielectric layer 134 and the protective layer 132 to form contact holes exposing the substrate 102. The contact hole is located between adjacent gate structures. Then, the conductive material is filled into the contact holes, and the conductive material is planarized to form contact structures 142*a*, 142*b* in the gap-filling dielectric layer 134. The contact structures 142*a* are located in the center region 10, and the contact structures 142*b* are located in the border region 20. Thereafter, other conventional processes can be performed to complete the non-volatile memory device 500, and these conventional processes will not be described in detail herein. The contact structures 142*a*, 142*b* can be used to electrically connect the source or the drain of the substrate 102 to the subsequently formed bit line and the external circuit. In some embodiments, each of the contact structures 142*a*, 142*b* includes a liner conformally formed on the surface of the contact hole and a conductive layer formed on the liner and filling the contact hole. The conductive layer includes tungsten, aluminum, copper, other suitable metals, or a combination thereof. The liner can improve the adhesion of the conductive layer to the substrate 102 or the gap-filling dielectric layer 134, and can prevent the metal atoms from diffusing into the substrate 102 or the gap-filling dielectric layer 134. The material of the liner may include titanium, titanium nitride, tungsten nitride, tantalum, tantalum nitride, other suitable conductive materials, or a combination thereof.

In one embodiment, the height H2 of the second gate structure 120*b* located in the border region 20 is higher than the height H1 of the first gate structure 120*a* located in the center region 10. More specifically, the thickness T2 of the floating gate layer 112*b* is greater than the thickness T1 of the floating gate layer 112*a*.

After performing a chemical mechanical polishing process on the floating gate layer 112, dishing may easily occur in the floating gate material located in the center region 10 in each array region 100, so that the thickness T1 of the floating gate layer 112*a* located in the center region 10 is smaller than the thickness T2 of the floating gate layer 112*b* located in the border region 20. By configuring the first width W1 of the first gate structure 120*a* to be greater than the second width W2 of the second gate structure 120*b*, the size (volume) of the floating gate layer 112*a* can be compensated, so that the size difference between the floating gate layer 112*a* and the floating gate layer 112*b* is reduced.

When an operating voltage is applied to the gate structure, electrons are injected into and stored in the floating gate layer. The number of electrons that the floating gate layer can store is proportional to the size of the floating gate layer. Furthermore, the number of electrons that the floating gate layer can store may decrease with time of use or environmental conditions (for example, high temperature). If the size of the floating gate layer is small, the number of electrons that the floating gate layer can store will be small, and the durability of the floating gate layer is also poor. In addition, when the volume of the floating gate layer is larger, the time required for programming and erasing is longer. Therefore, by configuring the first width W1 of the first gate structure 120*a* to be greater than the second width W2 of the second gate structure 120*b*, the data retention ability of the first gate structure 120*a* can be compensated, and the operating speed of the second gate structure 120*b* can be improved. As a result, the memory cells of the memory device can have similar data storage ability and operating speed.

In addition, since the height H2 of the second gate structure 120*b* located in the border region 20 is greater than the height H1 of the first gate structure 120*a* located in the center region 10, the contact holes located in the border region 20 will have higher aspect ratio. When the contact hole has a higher aspect ratio, it is easy to reduce the contact area between the contact structure 142*b* and the substrate 102, thereby causing the contact structure 142*b* located in the border region 20 to have a larger contact resistance. While applying the operating voltage, the number of electrons that can be injected (or removed) depends on the contact impedance of the corresponding one of the contact structures 142*a*. 142*b*. If the contact impedance of the contact structure 142*b* is higher, the number of electrons that can be injected (or removed) while applying the operating voltage is lower. Furthermore, the contact holes located in the border region 20 are more likely to fail to expose the substrate, resulting in the failure of the second gate structure 120*b*. By configuring the second spacing S2 between the second gate structures 120*b* to be larger than the first spacing S1 between the first gate structures 120*a*, the manufacturing margin of the contact holes located in the border region 20 can be improved, and the contact impedance of the contact structure 142*b* is compensated. As a result, the contact structure 142*a* and the contact structure 142*b* located in the center region 10 and the border region 20 respectively have similar contact impedances.

According to the manufacturing method of the non-volatile memory device provided in the present embodiment, the volume of the first floating gate located in the center region and the volume of the second floating gate located in the border region can be equal to or similar to each other, thereby improving the yield, reliability, and durability of the memory device without significantly increasing the complexity of the process and production cost.

More specifically, referring to FIG. 3A, after the floating gate material is planarized, the first thickness T1 of the floating gate layer 112 located in the center region 10 and the second thickness T2 of the floating gate layer 112 located in the border region 20 can be respectively measured. The first width W1 and the second width W2 can be determined according to the first thickness T1 and the second thickness T2, respectively. More specifically, the products of the thickness and the width of these floating gates are equal to or similar to each other. That is, the product (T1*W1) of the first thickness T1 and the first width W1 is equal to the product (T2*W2) of the second thickness T2 and the second width W2. Accordingly, the sizes of the floating gate layers located in the center region 10 and the border region 20 are equal to or similar to each other.

In some embodiments, the first width W1 plus the first spacing S1 is equal to the second width W2 plus the second spacing S2. The result of the difference between the first width W1 and the second width W2 divided by the first width W1 (that is, (W1−W2)/W1) is 0.5%-25.0%. In contrast, the result of the difference between the second spacing S2 and the first spacing S1 divided by the second spacing S2 (that is, (S2−S1)/S2) is 0.5%-25.0%.

Referring to FIG. 1, FIG. 3C, and FIG. 3D, the non-volatile memory device 500 includes a substrate 102, a plurality of first gate structures 120a, and a plurality of second gate structures 120b. The substrate 102 includes a center region 10 and two border regions 20 located in the array region 100. The border regions 20 are located outside the center region 10. The first gate structures 120a are located in the center region 10, and the second gate structures 120b are located in the border region 20. The first gate structure 120a has a first width W1 and a first height H1, and the second gate structure 120b has a second width W2 and a second height H2. The first width W1 is greater than the second width W2. The first height H1 is smaller than the second height H2. There is a first spacing S1 between two of the first gate structures 120a, and there is second spacing S2 between two of the second gate structures 120b. The first spacing S1 is smaller than the second spacing S2.

The first gate structure 120a includes a first floating gate 112a; the second gate structure 120b includes a second floating gate 112b. The first floating gate 112a has a first thickness T1, and the second floating gate 112b has a second thickness T2. The first thickness T1 is smaller than the second thickness T2. In one embodiment, the ratio of the product of the first thickness T1 and the first width W1 (T1*W1) to the product of the second thickness T2 and the second width W2 (T2*W2) is 0.95-1.05. Therefore, the volume of the floating gate 112a is equal to or similar to the volume of the second floating gate 112b. As a result, the durability, reliability, and operation consistency of the memory device can be improved.

Figure 4:
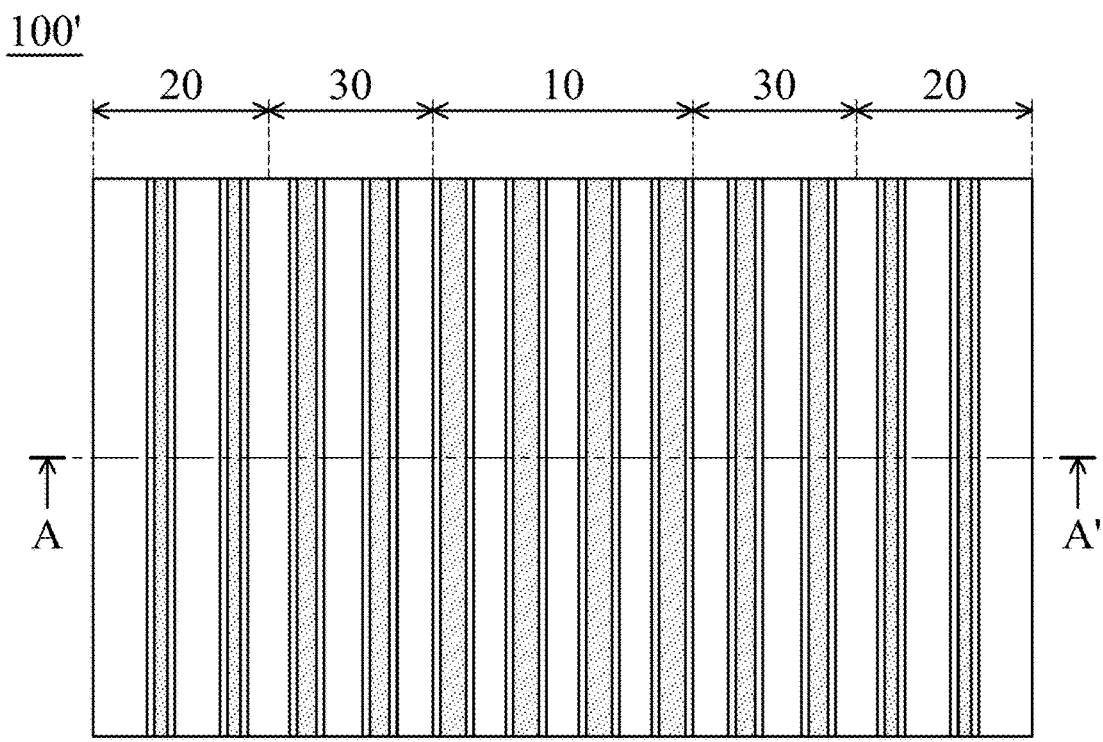
FIG. 4 is a top-view of an array region in accordance with other embodiments.
Figure 5:
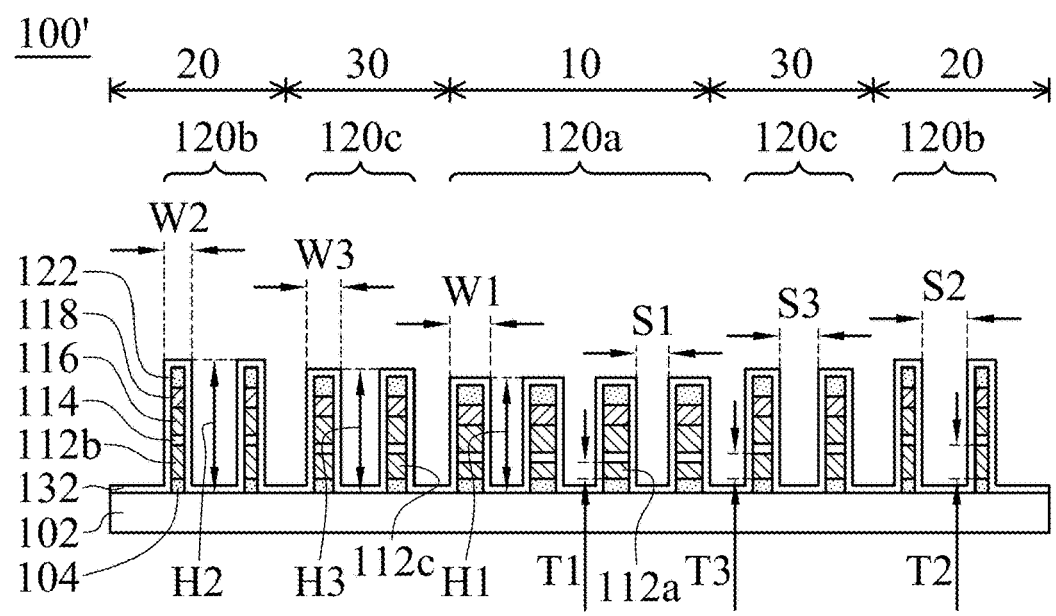
FIG. 5 is a cross-sectional view of an array region in accordance with other embodiments.

FIG. 4 is a top-view of an array region 100' in accordance with other embodiments. FIG. 5 is a cross-sectional view of an array region 100' in accordance with other embodiments. FIG. 4 and FIG. 5 are similar to FIG. 2 and FIG. 3A, respectively. In FIG. 4 and FIG. 5, the elements that are the same as those shown in FIG. 2 and FIG. 3A are denoted by the same reference numerals. In order to simplify the description, the elements and their forming process steps that are the same as those shown in FIG. 2 and FIG. 3A are not be described in detail herein.

The array region 100' shown in FIG. 4 is similar to the array region 100 shown in FIG. 2. In the array region 100', the substrate 102 further includes two middle regions 30. Each of the middle regions 30 is located between the center region 10 and one of the border regions 20, and these middle regions 30 are symmetrical to each other with a central line passing through the central point of the center region 10. Referring to FIG. 4 and FIG. 5, in the present embodiment, a plurality of third gate structures 120c are formed on the substrate 102 and located in the middle regions 30. In the present embodiment, the floating gate layer 112, the gate dielectric layer 114, the control gate layer 116, and the conductive metal layer 118 are patterned by using the capping layer 122 as a mask, so as to form a plurality of first gate structures 120a, a plurality of second gate structures 120b, and a plurality of gate structures 120c on the substrate 102 simultaneously.

In the present embodiment, after the planarization process is performed on the floating gate layer 112, the thicknesses of the floating gate layer 112 located in the center region 10, the border region 20, and the middle region 30 are measured, respectively. Referring to FIG. 5, the first floating gate 112a located in the center region 10 has a first thickness T1; the second floating gate 112b located in the border region 20 has a second thickness T2; and the third floating gate 112c located in the middle region 30 has a third thickness T3. The first floating gate 112a located in the center region 10 has a first width W1 and a first height H1; the second floating gate 112b located in the border region 20 has a second width W2 and a second height H2; and the third floating gate 112c located in the middle region 30 has a third width W3 and a third height H3. There is a first spacing S1 between two of the first gate structures 120a; there is a second spacing S2 between two of the second gate structures 120b; there is a third spacing S3 between two of the third gate structures 120c. In the present embodiment, the third thickness T3 is greater than the first thickness T1 and less than the second thickness T2. The third width W3 is smaller than the first width W1 and larger than the second width W2. The third height H3 is greater than the first height H1 and less than the second height H2. In other words, in the present embodiment, as the position of the gate structure is closer to the center of the array region, the thickness of the floating gate of the gate structure is smaller, and the width of the gate structure is larger.

In the present embodiment, the first width W1, the second width W2, and the third width W3 may be determined according to the first thickness T1, the second thickness T2, and the third thickness T3, respectively. More specifically, the products of the thickness and the width of these floating gates are equal to or similar to each other. In one embodiment, the ratio of the product of the first thickness T1 and the first width W1 (T1*W1) to the product of the second thickness T2 and the second width W2 (T2*W2) is 0.95-1.05, and the ratio of the product of the first thickness T1 and the first width W1 (T1*W1) to the product of the third thickness T3 and the third width W3 (T3*W3) is 0.95-1.05. As a result, the durability, reliability, and operation consistency of the memory device can be improved.

In some embodiments, the first width W1 plus the first spacing S1 is equal to the second width W2 plus the second spacing S2 and equal to the third width W3 plus the third spacing S3. The result of the difference between the first width W1 and the third width W3 divided by the first width W1 (that is, (W1−W3)/W1) is 1.0%-24.0%.

It should be understood that the array regions 100 and 100' respectively shown in FIG. 3C and FIG. 5 are merely for the purpose of illustration, and are not intended to limit the present invention. One skilled in the art may arbitrarily modify or combine the technical concepts disclosed in the embodiments of the present specification. For example, when the substrate 102 is observed from the top-view, the array region 100 may include a center region 10, two border regions 20, and a plurality of middle regions 30, and both sides of the array region 100 are symmetrical to each other with a central line passing through the central point of the center region 10. A plurality of middle regions 30 may be included between the center region 10 and the border region 20. In other words, in other embodiments, the array region 100 may be divided into a plurality of regions. In such an embodiment, the width of the gate structure in each region can be determined according to the thickness of the floating gate layer in each region, so that the product of the thickness and the width of the floating gate in these regions are equal to or similar to each other.

In summary, according to the non-volatile memory device and the manufacturing method provided in the embodiments of the present invention, the sizes of the floating gates of the gate structures in the array region can be equal to or similar to each other, and the spacing between the gate structures located in the border region of the array region is greater than the spacing between the gate structures located in the center region of the array region. Therefore, the operation consistency of the memory device can be significantly improved, and the problem of the failure of the memory device can also be reduced or avoided. As a result, the yield, reliability, and durability of the memory device can be greatly improved. Furthermore, according to the manufacturing method of the non-volatile memory device provided by the embodiments of the present invention, gate structures are formed with different widths in different regions, such a manufacturing method can be easily integrated into the existing manufacturing process without additional replacement or modification of production equipment. As a result, it will not significantly increase the complexity of the manufacturing process and production cost.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A non-volatile memory device, comprising:
   a substrate comprising a center region and two border regions located in an array region, wherein the border regions are located outside the center region; and
   a plurality of memory cells located in the array region, wherein the memory cells comprise:
   a plurality of first gate structures formed on the substrate and located in the center region, wherein each of the first gate structures has a first width, and there is a first spacing between two of the first gate structures; and
   a plurality of second gate structures formed on the substrate and located in one of the border regions, wherein each of the second gate structures has a second width smaller than the first width, and there is a second spacing between two of the second gate structures, wherein the second spacing is greater than the first spacing, and wherein each of the first gate structures comprises a first floating gate having a first thickness, each of the second gate structures comprises a second floating gate having a second thickness, and the first thickness is smaller than the second thickness.

2. The non-volatile memory device as claimed in claim 1, wherein each of the first gate structures has a first height, and each of the second gate structures has a second height greater than the first height.

3. The non-volatile memory device as claimed in claim 1, wherein a ratio of a product of the first thickness and the first width to a product of the second thickness and the second width is 0.95-1.05.

4. The non-volatile memory device as claimed in claim 1, wherein the first width plus the first spacing is equal to the second width plus the second spacing, and a result of a difference between the first width and the second width divided by the first width is 0.5%-25.0%.

5. The non-volatile memory device as claimed in claim 1, wherein the first gate structures are parallel to each other and extend along a first direction, the second gate structures are parallel to each other and extend along the first direction, and long axes of the border regions extend along the first direction.

6. The non-volatile memory device as claimed in claim 2, wherein the substrate further comprises two middle regions, wherein each of the middle regions is located between the center region and one of the border regions, and the non-volatile memory device further comprises:
   a plurality of third gate structures formed on the substrate and located in one of the middle regions, wherein each of the third gate structures has a third width smaller than the first width and greater than the second width, and there is a third spacing between two of the third gate structures, and wherein the third spacing is greater than the first spacing and smaller than the second spacing.

7. The non-volatile memory device as claimed in claim 6, wherein each of the third gate structures has a third height greater than the first height and smaller than the second height.

8. A method for manufacturing a non-volatile memory device, comprising:
   defining a center region and two border regions of an array region on a substrate, wherein the border regions are located outside the center region; and
   forming a plurality of memory cells located in the array region, the plurality of memory cells comprising:
   forming a plurality of first gate structures in the center region of the substrate, wherein each of the first gate structures has a first width, and there is a first spacing between two of the first gate structures; and
   forming a plurality of second gate structures in one of the border regions of the substrate, wherein each of the second gate structures has a second width smaller than the first width, and there is a second spacing between two of the second gate structures, wherein the second spacing is greater than the first spacing, and wherein forming the plurality of first gate structures and the plurality of second gate structures comprises:
   forming a floating gate material on the substrate; and
   performing a planarization process on the floating gate material to form a floating gate layer, wherein the floating gate layer has a first thickness in the center region, and the floating gate layer has a second thickness in each of the border regions, and wherein the second thickness is greater than the first thickness.

9. The method for manufacturing the non-volatile memory device as claimed in claim 8, wherein the plurality of first gate structures and the plurality of second gate structures are simultaneously formed, and wherein forming the plurality of first gate structures and the plurality of second gate structures comprises:
   after performing the planarization process, conformally forming a gate dielectric layer on the floating gate layer;
   conformally forming a control gate layer on the gate dielectric layer; and
   performing a patterning process on the floating gate layer, the gate dielectric layer, and the control gate layer to form the plurality of first gate structures and the plurality of second gate structures.

10. The method for manufacturing the non-volatile memory device as claimed in claim 9, further comprising:
    after the planarization process, measuring the first thickness and the second thickness, respectively; and determining the first width and the second width according to the first thickness and the second thickness, respectively.

11. The method for manufacturing the non-volatile memory device as claimed in claim 10, wherein a ratio of a product of the first thickness and the first width to a product of the second thickness and the second width is 0.95-1.05.

12. The method for manufacturing the non-volatile memory device as claimed in claim V, wherein defining the center region and the border regions on the substrate further comprises defining two middle regions on the substrate, wherein each of the middle regions is located between the center region and one of the border regions, and the method for manufacturing the non-volatile memory device further comprises:

forming a plurality of third gate structures in one of the middle regions of the substrate, wherein the plurality of first gate structures and the plurality of third gate structures are simultaneously formed in the same step, wherein each of the third gate structures has a third width smaller than the first width and greater than the second width, and there is a third spacing between two of the third gate structures, and wherein the third spacing is greater than the first spacing and smaller than the second spacing, wherein after the planarization process, the floating gate layer located in each of the middle regions has a third thickness greater than the first thickness and smaller than the second thickness.

13. The method for manufacturing the non-volatile memory device as claimed in claim 12, further comprising:

after the planarization process, measuring the first thickness, the second thickness, and the third thickness, respectively; and determining the first width, the second width, and the third width according to the first thickness, the second thickness, and the third thickness, respectively, wherein a ratio of a product of the first thickness and the first width to a product of the second thickness and the second width is 0.95-1.05, and a ratio of the product of the first thickness and the first width to a product of the third thickness and the third width is 0.95-1.05.

* * * * *